United States Patent [19]

Long et al.

[11] Patent Number: 5,119,040

[45] Date of Patent: Jun. 2, 1992

[54] METHOD AND APPARATUS FOR OPTIMIZING THE PERFORMANCE OF A POWER AMPLIFIER CIRCUIT

[75] Inventors: James F. Long, Glen Ellyn; Mark G. Obermann, Niles, both of Ill.

[73] Assignee: Motorola, Inc., Schaumburg, Ill.

[21] Appl. No.: 637,432

[22] Filed: Jan. 4, 1991

[51] Int. Cl.⁵ .............................................. H03F 1/26
[52] U.S. Cl. .................................... 330/149; 330/151; 455/63; 455/126; 455/50.1
[58] Field of Search ................. 330/149, 151, 52, 136; 455/50, 63, 126

[56] References Cited

U.S. PATENT DOCUMENTS

| | | | |
|---|---|---|---|
| 3,202,928 | 8/1965 | Prior | 330/149 |
| 3,213,387 | 10/1965 | Snijders | 330/149 |
| 3,231,819 | 1/1966 | Aaron | 330/149 |
| 3,815,040 | 6/1974 | Seidel | 330/151 |
| 4,412,185 | 10/1983 | Gerard | 330/149 |
| 4,577,238 | 3/1986 | Watanabe | 328/162 |
| 4,580,105 | 4/1986 | Myer | 330/52 |
| 4,701,717 | 10/1987 | Radermacher et al. | 330/149 |
| 4,879,519 | 11/1989 | Myer | 330/149 |
| 4,885,551 | 12/1989 | Myer | 330/52 |

FOREIGN PATENT DOCUMENTS 2107540 4/1983 United Kingdom .

OTHER PUBLICATIONS

"Intermodulation Interference in Radio Systems", by Wallace C. Babcock, The Bell System Technical Journal, Jan. 1953, pp. 63–73.

"Intermodulation Effects in Limiter Amplifier Repeaters" by Frederick E. Bond and Harold F. Meyer, IEEE Transactions on Communication Technology, vol. Com-18, No. 2, Apr. 1970, pp. 127–135.

"Consideration of Nonlinear Noise and its Testing in Frequency Division Multiplex Voice UHF Radio Communication Systems", by Leang P. Yeh, IRE Transactions on Communications Systems, pp. 115–129.

*Primary Examiner*—Eugene R. Laroche
*Assistant Examiner*—Tan Dinh
*Attorney, Agent, or Firm*—Val Jean F. Hillman

[57] ABSTRACT

The present invention discloses a method and apparatus for optimizing the performance of a power amplifier circuit. In accordance therewith, one of the intermodulation products generated during a power amplifier's operation is selected. This selection is based upon the intermodulation product's amplitude. Next, the intermodulation product's amplitude is compared to a predetermined threshold. Based upon this comparison, various power amplifier circuit operating parameters are altered in order to improve the circuit's intermodulation performance or to maximize its operating capacity.

20 Claims, 2 Drawing Sheets

METHOD AND APPARATUS FOR OPTIMIZING THE PERFORMANCE OF A POWER AMPLIFIER CIRCUIT

FIELD OF THE INVENTION

The present invention relates generally to power amplifiers and more particularly to a method and apparatus for optimizing the linear performance of a power amplifier circuit.

BACKGROUND OF THE INVENTION

Power amplifiers are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear; a perfect replica of the input signal increased in amplitude appears at the amplifier output. In reality, however, all linear amplifiers have a degree of non-linearity in their transfer characteristics. This non-linearity results in a distortion of the output signal so that it is no longer a perfect replica of the input. This distortion produces spurious signal components known as intermodulation products. Intermodulation products are undesirable because they cause interference, cross talk, and other deleterious effects on the performance of a system employing power amplifiers. Accordingly, the prior art reflects various methods and devices designed to reduce the distortion produced during a power amplifier circuit's operation. Two methods commonly suggested are predistortion and feed forward. Both methods are well known in the art, therefore no further discussion is provided herein. Regardless of the type distortion reduction employed in the power amplifier circuit's design, it would be extremely advantageous to provide a method and apparatus for evaluating the circuit's intermodulation performance, and in response thereto, adjusting various operating parameters to optimize the power amplifier circuit's performance.

SUMMARY OF THE INVENTION

Briefly described the present invention is a method and apparatus for optimizing the performance of a power amplifier circuit. In this effort, at least one of the intermodulation products generated during a power amplifier's operation is identified. This identification is based upon the intermodulation product's amplitude. Typically, the intermodulation product identified as having the greatest amplitude is selected. Next, that intermodulation product's amplitude is compared to a predetermined threshold. Based upon this comparison, various power amplifier circuit operating parameters are altered in order to optimize the performance of the power amplifier circuit.

According to one aspect of the invention, the identification process is accomplished by isolating a total intermodulation product signal energy comprised of a plurality of intermodulation products and determining the one intermodulation product from among the plurality having the greatest amplitude.

According to another aspect of the invention, the identification process is accomplished by scanning a prescribed frequency range to detect individual intermodulation products and selecting the one intermodulation product having the greatest amplitude.

According to another aspect of the invention, the identification process is accomplished by gathering empirical data that permits a selection of the one intermodulation product having the greatest amplitude.

According to yet another aspect of the present invention, the identified intermodulation product is compared to a highest amplitude carrier signal in order to determine a carrier to distortion ratio. In response to the resultant ratio, various power amplifier circuit operating parameters are altered in order to improve the circuit's intermodulation performance or to maximize the power amplifier circuit's operating capacity, thereby optimizing circuit performance.

DETAILED DESCRIPTION OF THE PREFERRED EMBODIMENT

Figure 1:
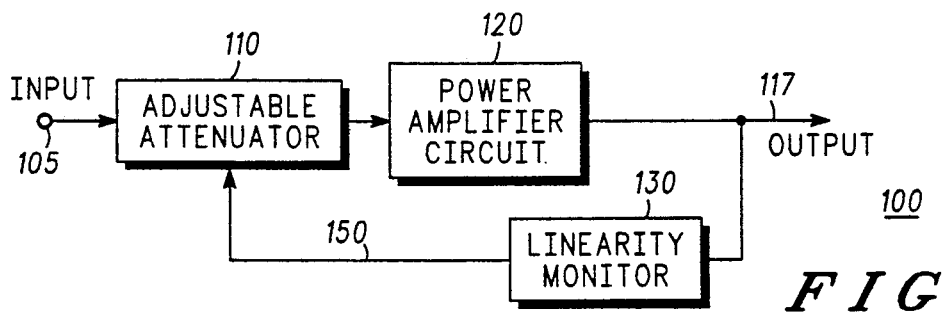
FIG. 1 depicts a circuit, in block diagram form, incorporating the linearity monitor according to the present invention.

Referring to FIG. 1, there is shown in block diagram form, a circuit 100 incorporating the linearity monitor 130 according to the present invention. A composite input signal 105, which may comprise a plurality of RF carriers, is input into adjustable attenuator 110. It will be appreciated by those skilled in the art that the adjustable attenuator is employed to adjust the signal level of the input signal 105, prior to its presentation to power amplifier circuit 120.

The power amplifier circuit 120 is designed to amplify the input signal and then provide an amplified output signal at lead 117. As previously mentioned, distortion and intermodulation products may be introduced during this amplification. Accordingly, the power amplifier circuit of FIG. 1 is designed to substantially remove all distortion and intermodulation prior to output 117.

Figure 2:
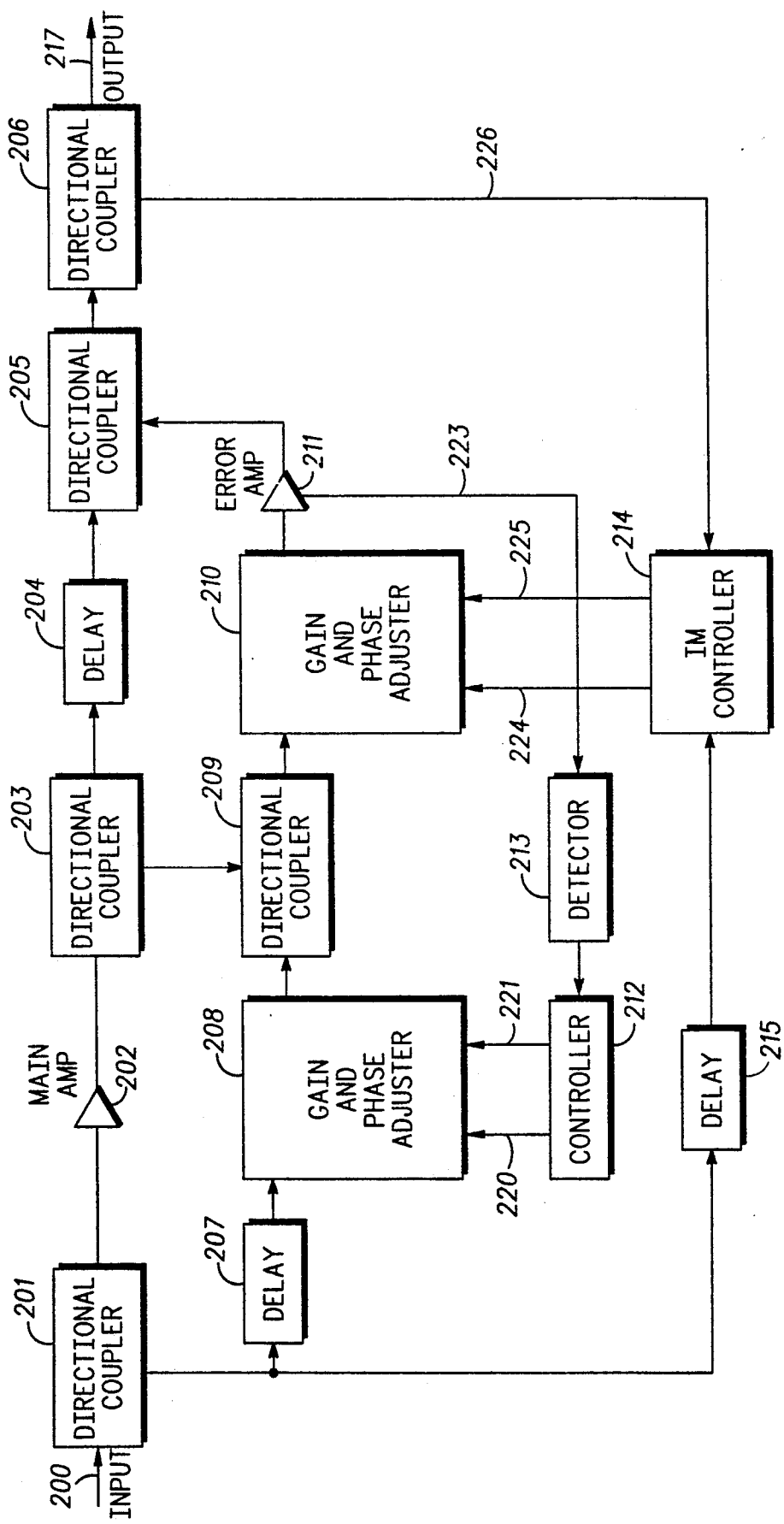
FIG. 2 shows a detailed block diagram of the power amplifier circuit of FIG. 1.

FIG. 2 shows a detailed block diagram of the power amplifier circuit of FIG. 1. A precise explanation of this circuit's operation may be found in U.S. Pat. No. 5,077,532, issued Dec. 31, 1991 and assigned to the assignee of the present application. While FIG. 2 depicts one embodiment of a power amplifier circuit, it will be appreciated by those skilled in the art that this configuration is presented for the purpose of example and in no way limits the scope of the linearity monitor disclosed herein.

For further details on power amplifier circuits that may benefit from the disclosed linearity monitor, reference may be made to U.S. Pat. No. 4,580,105 Meyer, U.S. Pat. No. 4,885,551 Meyer, and U.S. Pat No. 3,815,040 Seidel.

In order to optimize the performance of the power amplifier circuit 120, the present invention employs a linearity monitor 130. This device is designed to identify intermodulation products within a power amplifier circuit's output, select that intermodulation product having the greatest signal amplitude, and compare that amplitude to a predetermined threshold. Based upon this comparison, various operating parameters are altered in order to improve the circuit's intermodulation performance or to maximize the circuit's operating capacity.

For example, the linearity monitor may control the power level of the input signals presented to the power amplifier circuit. According to the embodiment depicted in FIG. 1, if the selected intermodulation product's amplitude exceeds a predetermined threshold, the linearity monitor 130 will initiate an alarm. This signal, and associated circuitry, controls the attenuation of adjustable attenuator 110, via lead 150, in order to decrease the amplifier input power. A decrease in the amplifier input power is calculated to reduce the amplitude of the intermodulation products appearing at output 117. By reducing the level of intermodulation at the amplifier circuit's output, the linearity monitor acts to improve the intermodulation performance of power amplifier circuit 120.

If, on the other hand, the selected intermodulation product's amplitude fails to approach the predetermined threshold, there is an indication that the amplifier circuit is being underutilized. In response, the linearity monitor can adjust the attenuation of the adjustable attenuator 110 to increase the input power of the input signal 105, so long as the intermodulation products appearing at output signal 117 remain below acceptable levels. Other operating parameters that may be controlled include, but are not limited to the power amplifier's supply voltage and biasing.

In conjunction with input signal power, supply voltage, and bias controls, the linearity monitor may be permitted to control the number of carriers presented to the power amplifier circuit. Thus, when the selected intermodulation product's amplitude exceeds the predetermined threshold, in addition to varying some or all of the operating parameters, any additional carriers presented to the power amplifier circuit can be blocked in order to avoid further amplifier overuse. By definition, amplifier overuse occurs when the amplifier circuit attempts to support more carriers than it was designed to, or fails to achieve expected levels of intermodulation rejection. In either case, the combination of reducing the input signal power and blocking additional carriers will improve the circuit's intermodulation performance and permit a recovery. Conversely, to maximize the full capabilities of the power amplifier circuit, the linearity monitor is permitted to present additional carriers to the power amplifier circuit, so long as amplifier overuse is avoided.

Figure 3:
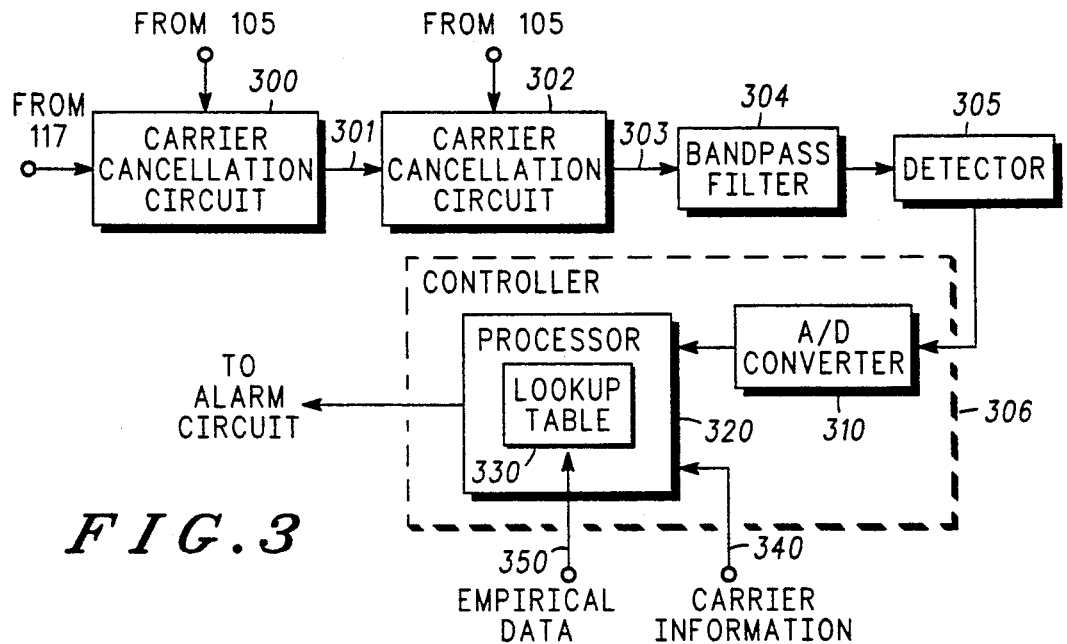
FIG. 3 shows a detailed block diagram of the linearity monitor according to the present invention.

Referring to FIG. 3, there is shown a detailed block diagram of the linearity monitor according to the present invention. In operation, the linearity monitor receives a portion of the output signal 117 from the power amplifier circuit 120. This signal comprises both carrier components and intermodulation products. In addition, the linearity monitor receives an input from input signal 105 which comprises only carrier components. Both inputs are presented to a first carrier cancellation circuit 300. It will be appreciated by those skilled in the art that if the phase, gain and delay of the two input signals to circuit 300 are properly adjusted, the carrier components of the signal from 117 and the carrier components of the signal from 105 will substantially cancel to produce an error signal on lead 301. This error signal is then routed to carrier cancellation circuit 302, which is identical in operation to the carrier cancellation circuit 300.

For further detail on carrier cancellation circuits 300 and 302, reference may be made to U.S. Pat. No. 5,077,532, issued Dec. 31, 1991 and, assigned to the assignee of the present application.

In most cases after one carrier cancellation operation, the carrier energy in an error signal spectrum still overpowers the intermodulation product signal energy. Therefore, to fully isolate the intermodulation products from the carrier signals, a second carrier cancellation operation is performed which reduces the carrier signal energy to at least the level of the intermodulation product energy.

The output from carrier cancellation circuit 302 is an error signal on lead 303. This error signal may be routed to bandpass filter 304 which removes a set of unwanted frequencies. In practice, the bandpass filter has a bandwidth centered about and at least three times greater than that of the power amplifier's bandwidth. Since the primary purpose of the bandpass filter 304 is to remove spurious signal which may exist well outside the amplifier's bandwidth, it will be appreciated by those skilled in the art that bandpass filtering may not always be a necessity. Typically, signals well outside the amplifier's bandwidth are to small to consistently be problematic. therefore bandpass filtering may be omitted without departing from the spirit of the present invention.

From bandpass filter 304, the filtered error signal is routed to detector 305. In the preferred embodiment detector 305 is a diode detector, such as, for example, a simple Schottky type diode detector which provides a DC voltage in response to the error signal. In practice detector 305 may be any detector which detects the total intermodulation product energy of the error signal, which comprises a plurality of intermodulation products. Alternative detectors include, for example, amplifying detectors, DC current detectors and RF voltage detectors. At this point the linearity monitor has isolated the total intermodulation product energy. Next, the output of detector 305 is routed to controller 306, which selects the individual intermodulation product from within the total intermodulation energy spectrum having the greatest amplitude.

According to FIG. 3, controller 306 includes analog to digital converter 310 and processor unit 320, which contains a lookup table 330. In operation, the output of detector 305 is routed to the analog to digital converter 310, where it is converted to a digital value and routed to the processor 320. Processor 320 is a microprocessor device which employs a EEPROM lookup table 330. Such devices are well known in the art.

According to FIG. 3, the processor receives additional inputs which facilitate the selection process. From lead 340, the processor receives information regarding the carriers presented to the power amplifier circuit. Such information typically includes the number of carriers presented, the spacing or location of those carriers within the passband, and the amplitude of each carrier. Armed with this information, the processor, utilizing known mathematical equations, can determine the amplitude of at least one intermodulation product having an amplitude at least equal to that of all the other products within the total intermodulation product energy spectrum.

For further discussion on the process of calculating the amplitude of intermodulation products, reference may be made to "Intermodulation Effects in Limiter Amplifier Repeaters," Frederick Bond and Harold F. Meyer IEEE Transactions on Communication Technology, Vol. Com-18, No.2, April 1970, pages 127–135; "Intermodulation Interference In Radio Systems," Wallace C. Babcock, The Bell Systems Technical Journal, January 1953, pages 63–73; and "Consideration of Nonlinear Noise and Its Testing in Frequency Division Multiplex Voice UHF Radio Communication Systems," Leang P. Yeh, IRE Transactions on Communication Systems, June 1961, pages 115–129 each incorporated herein by reference.

It will be appreciated by those skilled in the art that the mathematical calculations performed by the processor 320 are most accurate when the carrier information describes a Gaussian or near Gaussian carrier distribution pattern. Such distributions are characterized by equidistant spacing of received carriers as well as equal carrier amplitudes. When carrier spacing and amplitudes are non-uniform, however, this method of determining an intermodulation product's amplitude becomes less reliable. In response, the processor will employ lookup table 330, which contains empirical data regarding maximum intermodulation product amplitudes for specific non-uniform carrier distribution patterns.

Accordingly, when the carrier information presented at lead 340 suggests a Gaussian or uniform carrier distribution, processor 320 will calculate a value for the intermodulation product having the highest amplitude. As previously discussed this calculation is based upon known teachings which derive the amplitude from both carrier information and the total intermodulation product energy. When the carrier information is descriptive of a non-uniform carrier distribution, however, the processor will seek to match the received carrier information with a similar description stored in lookup table 330. Therefore, each lookup table entry includes information pertaining to a number of received carriers, each carriers location, each carriers amplitude, a value for the total intermodulation product spectral energy, and an amplitude for the selected intermodulation product. By matching the received information with previously stored descriptions, the processor is able to provide a value for the intermodulation product amplitude in those instances where calculation is impractical.

Upon a determination of the value for the intermodulation amplitude, the processor compares the determined value to a predetermined threshold. As previously discussed, in response to the comparison, changes to various operating parameters are effected in order to improve the intermodulation performance or to maximize the operating capacity of the power amplifier circuit.

Figure 4:
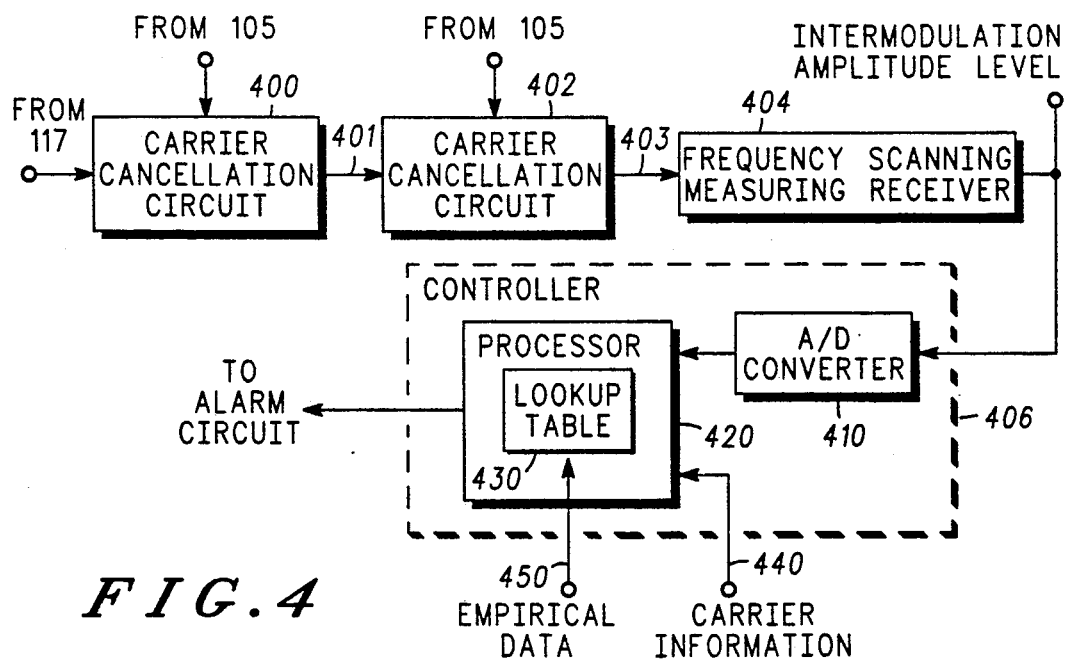
FIG. 4 shows another embodiment of the linearity monitor according to the present invention.

Referring to FIG. 4, there is shown another embodiment of the linearity monitor according to the present invention. According to FIG. 4 there is disclosed first and second carrier cancellation circuits 400 and 402 which operate in accordance with the description of FIG. 3. The error signal on lead 403 is fed into a frequency scanning measuring receiver 404, which scans the error signal over a prescribed frequency range to detect individual intermodulation products. In addition, the frequency scanning measuring receiver 404 may select from the detected intermodulation products, the single product having the greatest amplitude. Thereafter, the intermodulation product amplitude level is routed to the analog-to-digital converter 410 of controller 406, converted to a digital value, routed to processor 420, and compared to a predetermined threshold. Once again, in response to the comparison, changes to various system parameters are effected in order to optimize the performance of the power amplifier circuit.

According to yet another embodiment, inclusive in the carrier information is the identification of the highest amplitude carrier signal. After the selection of the desired intermodulation product amplitude, the processor unit compares the intermodulation product amplitude to the identified carrier's amplitude in order to calculate a carrier to distortion ratio. Thereafter, the previously mentioned operating parameters are altered in response to the ratio to once again optimize the performance of the power amplifier circuit.

Based upon this discussion, it will be appreciated that the primary purpose of the disclosed linearity monitor is to properly identify and isolate the total intermodulation product energy within a power amplifier circuit's output, select the at least one intermodulation product having the greatest amplitude, compare the intermodulation product's amplitude to a predetermined threshold, or to a selected carrier signal, and in response thereto, adjust various operating parameters in order to optimize the performance of the power amplifier circuit.

What is claimed is:

1. A method for optimizing the performance of a power amplifier circuit having a plurality of power amplifier circuit operating parameters, said method comprising the steps of:
   isolating a single intermodulation product having an amplitude at least equal to that of all other intermodulation products generated during a power amplifier's operation;
   comparing the isolated intermodulation product's amplitude to a predetermined threshold; and
   altering at least one of the power amplifier circuit's operating parameters in response to the comparison in order to optimize the power amplifier circuit's performance.

2. The method according to claim 1 wherein the step of isolating the single intermodulation product further comprises the steps of:
   detecting a total intermodulation product signal energy comprising a plurality of intermodulation products by gathering empirical data; and
   identifying the single intermodulation product having an amplitude at least equal to that of all other intermodulation products within the detected signal.

3. The method according to claim 1 wherein the step of isolating the single intermodulation product further comprises the steps of:
   scanning a prescribed frequency range to detect individual intermodulation products; and
   selecting the one intermodulation product having a greatest amplitude.

4. The method according to claim 3 further comprising the step of:
   filtering the detected signal to remove frequencies outside a band width centered about and at least three times greater than the power amplifier's band width.

5. The method according to claim 2 wherein the step of identifying one intermodulation product further comprises the steps of:
   gathering information regarding carriers presented to the power amplifier circuit;
   calculating an intermodulation product power spectral density gased upon the gathered carrier information; and estimating the one intermodulation product's amplitude based upon the power spectral density calculations.

6. The method according to claim 5 wherein the step of gathering information regarding the carriers further comprises the steps of:
   determining a number of carriers presented to the power amplifier circuit;
   establishing each carrier's location within a passband; and
   establishing each carrier's amplitude.

7. The method of claim 2 wherein the step of identifying further comprises the step of calculating the one intermodulation product's amplitude by mathematical equation.

8. The method of claim 1 wherein the step of altering operating parameters includes, but is not limited to, at least one of the following:
   adding additional carriers to the input signal; and
   increasing the power amplifier's input power.

9. The method according to claim 1 further comprising the step of initiating an alarm when the identified intermodulation product's amplitude exceeds the predetermined threshold.

10. The method of claim 9 further comprising at least one of the following steps:
   blocking the presentation of additional carriers to the power amplifier;
   varying the power amplifier's supply voltage;
   adjusting the power amplifier's biasing; and
   decreasing the amplifier input power, in response to the alarm.

11. A linearity monitor for optimizing the performance of a power amplifier circuit having a plurality of power amplifier circuit operating parameters, comprising:
   means for isolating a single intermodulation product having an amplitude at least equal to that of all other intermodulation products generated during a power amplifier's operation;
   means for comparing the isolated intermodulation product to a predetermined threshold; and
   means for altering at least one of the power amplifier circuit's operating parameters in response to the comparison in order to optimize the power amplifier circuit's performance.

12. The linearity monitor according to claim 11 wherein the means for isolating the single intermodulation product further comprises:
   means for detecting a total intermodulation product spectral power level comprising a plurality of intermodulation products; and
   means for identifying the single intermodulation product having the highest amplitude.

13. The linearity monitor according to claim 11 wherein the means for isolating a single intermodulation product further comprises:
   means for scanning a prescribed frequency range to detect individual intermodulation products; and
   means for selecting the one intermodulation product having the highest amplitude.

14. The linearity monitor according to claim 11 wherein the means for isolating a single intermodulation product further comprises:
   means for gathering information regarding carriers presented to the power amplifier circuit;
   means for calculating an intermodulation product power spectral density based upon the gathered carrier information; and
   means for estimating the intermodulation product's amplitude based upon the power spectral density calculations.

15. A method for optimizing the performance of a power amplifier circuit having a plurality of operating parameters, said circuit amplifying an input signal having at least one carrier therein and distorting said amplified signal by a prescribed distortion characteristic, said method comprising the steps of:
   isolating a single intermodulation product having an amplitude at least equal to that of all other intermodulation products generated during the power amplifier's operation;
   comparing the isolated intermodulation product to at least one carrier within the input signal;
   calculating a carrier to distortion ratio based upon the comparison; and
   adjusting at least one operating parameters in response thereto in order to optimize the power amplifiers circuit's performance.

16. The method of claim 15 wherein the step of isolating the single intermodulation product further comprises the step of:
   scanning a prescribed frequency range to detect individual intermodulation products; and
   selecting the intermodulation product having a greatest amplitude.

17. The method of claim 15 wherein the step of isolating the single intermodulation product further comprises the steps of:
   detecting a total intermodulation product signal energy comprising a plurality of intermodulation products; and
   identifying the single intermodulation product having an amplitude at least equal to that of all other intermodulation products within the detected signal.

18. The method of claim 15 wherein the step of isolating the single intermodulation product further comprises the steps of:
   determining a number of carriers presented to the power amplifier circuit;
   establishing each carrier's location within a pass band;
   establishing each carrier's amplitude;
   calculating an intermodulation product power spectral density as a function of carrier locations and amplitudes; and
   estimating the single intermodulation product's amplitude as a function of the power spectral density calculations.

19. The method of claim 15 wherein the step of comparing further comprises the step of selecting a carrier having an amplitude at least equal to that of all other carriers within the input signal.

20. The method of claim 15 wherein the step of adjusting at least one operating parameter includes, but is not limited to, at least one of the following:
   increasing power amplifier input power;
   decreasing power amplifier input power;
   adding carriers to the input signal;
   deleting carriers from the input signal;
   varying the power amplifier's supply voltage; and
   adjusting the power amplifier's biasing.

* * * * *